United States Patent [19]

Baltus et al.

[11] Patent Number: 4,939,517

[45] Date of Patent: Jul. 3, 1990

[54] CIRCUIT FOR SYNCHRONIZING TRANSITIONS OF BITS IN A DIGITAL CODE

[75] Inventors: Peter G. Baltus, Sunnyvale, Calif.; Rudy J. van de Plassche, Waalre, Netherlands

[73] Assignee: North American Philips Corporation, Signetics Division, Sunnyvale, Calif.

[21] Appl. No.: 155,403

[22] Filed: Feb. 12, 1988

[51] Int. Cl.$^5$ .............................................. H03M 1/14
[52] U.S. Cl. ....................................... 341/156; 341/159
[58] Field of Search ...................... 341/120, 156, 159

[56] References Cited

U.S. PATENT DOCUMENTS

| | | | |
|---|---|---|---|
| 4,430,642 | 2/1984 | Weigand et al. | 341/159 |
| 4,612,531 | 9/1986 | Dingwall et al. | 341/156 |
| 4,635,036 | 1/1987 | Yoshizawa | 341/156 |

OTHER PUBLICATIONS

R. Van de Plassche et al.; "A High-Speed 7 Bit A/D Converter"; IEEE JSSC; Dec. 1979, pp. 938-943.
R. Van de Grift et al.; "A High Performance 8 Bit Video A/D Converter"; European Solid-State Circs, Conf.; 16-18, Sep. 1986; 3 pp.
R. Van de Grift et al.; "AN 8b 50 MHz Video ADC With Folding And Interpolation Techniques"; IEEE Int'L S. S. C. Conf.; Feb. 1987; pp. 94-95.

*Primary Examiner*—William M. Shoop, Jr.
*Assistant Examiner*—Marc S. Hoff
*Attorney, Agent, or Firm*—R. Meetin; T. Briody

[57] ABSTRACT

An electronic circuit contains a main stage (10 and 12) that produces a digital code consisting of a plurality of bits ($B_1$–$B_{M-1}$) that make binary transitions as a function of an input parameter ($V_I$). A synchronization stage (14 and 16) synchronizes transitions of bits ($B_0$–$B_{K-1}$) in one part of the code with corresponding transitions of bits ($B_K$–$B_{M-1}$) in another part. When the input parameter is in transition regions where bits in the first-mentioned part of the code could go to wrong values, the synchronization stage suitably replaces the values of bits in the first part with information based on bits in the other part.

14 Claims, 6 Drawing Sheets

CIRCUIT FOR SYNCHRONIZING TRANSITIONS OF BITS IN A DIGITAL CODE

FIELD OF USE

This invention relates generally to electronic switching circuitry and, more particularly, to circuits that synchronize transitions of bits in one part of a digital code with transitions of bits in another part of the code.

BACKGROUND ART

In an analog-to-digital converter (ADC) of the folding type, the bits that form the digital output code are typically generated along two largely separate paths. A coarse conversion circuit produces a set of coarse (higher-order) bits directly in response to an analog input voltage. A fine conversion circuit produces a set of fine (lower-order) bits in response to one or more signals supplied from a circuit that folds the input voltage. See van de Grift et al, "A Monolithic 8-Bit Video A/D Converter," *IEEE JSSC*, Jun. 1984, pp. 374–378.

One difficulty with a folding ADC is that the bits in the coarse set sometime make transitions between binary "0" and binary "1" at values of the input voltage that are slightly different from those at which the bits in the fine set make corresponding transitions between "0". For example, consider a simple 4-bit "binary member" code consisting of two bits supplied from the coarse converter and two bits supplied from the fine converter. Assume that the input voltage is in that portion of the input voltage range where the code is (0011). The leftmost bit is the most significant bit (MSB). The rightmost bit is the least significant bit (LSB).

If the input voltage is increased by an amount equivalent to one LSB, the code should change to (0100). This is not always the case. Because the coarse bits are generated along a separate path from the fine bits, phenomena such as input offset errors, delay differences, and/or noise may cause the second most significant bit to switch from "0" to "1" either before or after the two fine bits switch from "1" to "0". The code changes either to (0111) or to (0000). The actual value produced by the code is nowhere near the intended (0100). A similar problem occurs with the MSB.

GENERAL DISCLOSURE OF THE INVENTION

The present invention is an electronic circuit that utilizes a bit synchronization scheme to overcome bit transition problems of the foregoing type. The starting point for the invention is a main stage that produces a digital code formed with a plurality of bits that make transitions between a pair of binary values as a function of an input parameter. The transitions ideally occur in accordance with a prescribed algorithm as the input parameter traverses a suitable input range. The bits are divided into first and second sets, each consisting of one or more bits. The bits in the second set are usually generated along a different electronic path through the main stage than those in the first.

A synchronization stage synchronizes transitions of bits in the first set with corresponding transitions of bits in the second set. The basic approach is to define transition regions for bits in the first set. A transition region is basically that portion of the input range where phenomena of the type mentioned above can cause a bit in the first set to go to a wrong value. Using signals keyed to the transition regions, the values of bits in the first set are suitably replaced with information based on bits in the second. A single bit in the second set is preferably used in making every replacement in a transition region. No replacements are made outside the transition regions.

In particular, the synchronization stage implements this scheme with a control circuit and a substitution circuit. The control circuit generates at least one synchronization signal. Each synchronization signal reaches a specified condition when the input parameter is in a transition region of the input range where a bit in the first set associated with that synchronization signal makes a single transition and where a corresponding bit in the second set makes a single transition. When each synchronization signal reaches its specified condition, the substitution circuit replaces the value of each associated bit in the first set either with the value of the corresponding bit in the second set or with the value of the complement of the corresponding bit in the second set in such a way as to satisfy the prescribed algorithm.

The algorithm is typically a binary number code in which each bit in the first set is a coarse bit and in which each bit in the second set is a fine bit. In this case, only the most significant fine bit is used in performing the replacements. The substitution circuit specifically replaces the value of each coarse bit either with the value of the complement of the most significant fine bit if that coarse bit is the most significant bit making a transition within the appropriate transition region or with the value of the most significant fine bit if that coarse bit is not the most significant bit making a transition within the transition region.

The invention eliminates synchronization errors in an easy and dependable way. In folding ADCs, the synchronization can be achieved with a small amount of circuitry.

BRIEF DESCRIPTION OF THE DRAWINGS

Like reference symbols are employed in the drawings and in the description of the preferred embodiments to represent the same or very similar item or items. "N" is used as a subscript to indicate signals complementary to previously defined signals.

DESCRIPTION OF THE PREFERRED EMBODIMENTS

Figure 1:
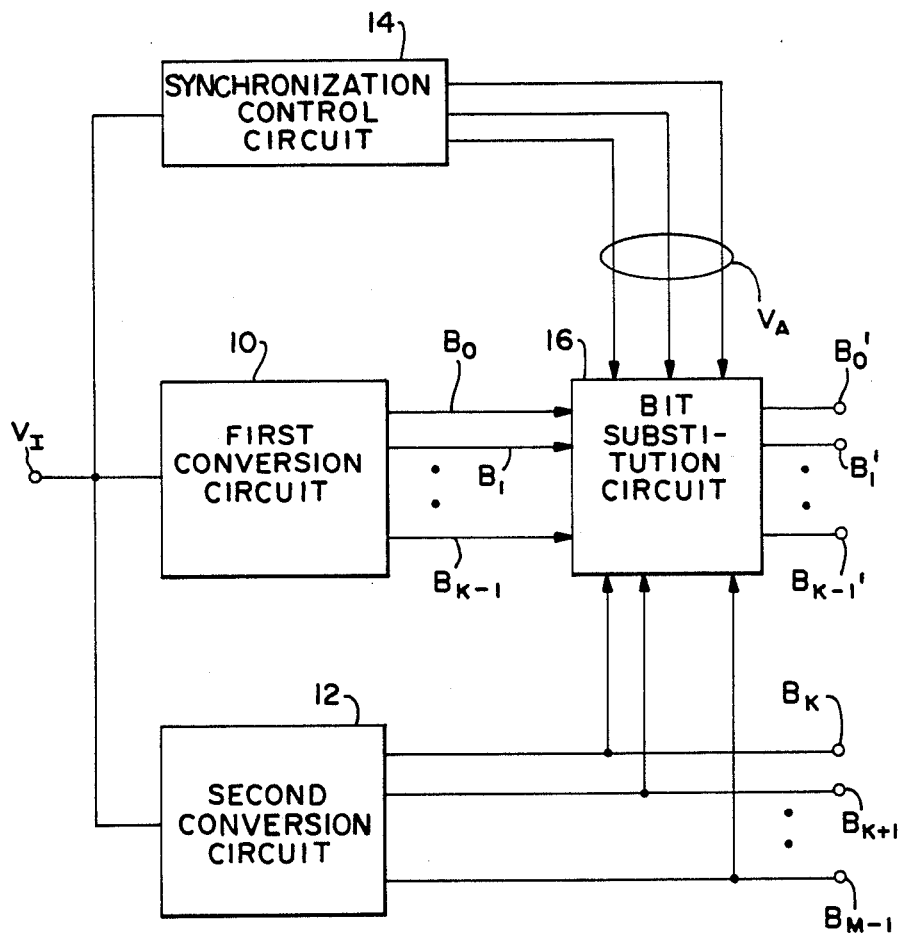
FIG. 1 is a block diagram of an ADC employing a bit synchronization scheme in accordance with the invention.

Referring to the drawings, FIG. 1 illustrates an analog-to-digital converter containing a main stage that converts an analog input voltage $V_I$ into an M-bit digital code divided into a set of K first binary bits $B_0, B_1, \ldots B_{K-1}$ and a set of M-K second binary bits $B_K, B_{K+1}, \ldots B_{M-1}$. K is typically two or more but may be as small as 1. The same applies to M-K.

Bits $B_0$–$B_{M-1}$ make transitions between "0" and "1" as input voltage $V_I$ traverses an input range extending from a low voltage level $V_O$ to a high voltage level $V_F$. The code is fixed at one value, usually "all 0s", when input $V_I$ is at or below $V_O$. The code is fixed at another value, usually "all 1s", when input $V_I$ is at or above $V_F$. The binary transitions ideally occur in accordance with a prescribed algorithm.

The main ADC stage consists of a first conversion circuit 10 and a second conversion circuit 12. Conversion circuit 10 generates bits $B_0$–$B_{K-1}$ along one general electronic path. Conversion circuit 12 similarly generates bits $B_K$–$B_{M-1}$ along another general electronic path.

Slight, but significant, differences in signal transmission delay typically exist between the two paths. If not suitably accounted for, these delay differences can cause transitions in certain of bits $B_0$–$B_{M-1}$ to occur at wrong points. The same applies to noise. Small offset errors in the input circuitry of circuits 10 and 12 affect the values of input $V_I$ at which bits $B_0$–$B_{M-1}$ make their transitions. A bit synchronization stage operating according to the teachings of the invention synchronizes transitions of bits $B_0$–$B_{K-1}$ in the first-mentioned set with corresponding transitions of bits $B_K$–$B_{M-1}$ in the second-mentioned set so as to avoid code errors due to the preceding phenomena.

The synchronization stage is formed with a synchronization control circuit 14 and a bit substitution circuit 16. Control circuit 14 generates one or more synchronization voltage signals $V_A$ that indicate when bits $B_0$–$B_{K-1}$ in the first set are near values of input $V_I$ at which these bits make transitions that are ideally intended to be simultaneous with transitions of bits $B_K$–$B_{M-1}$ in the second set. When one of the $V_A$ signals provides such an indication for one of the bits in the first set, substitution circuit 16 replaces the current value of that bit with information derived from the bits in the second set. Circuit 16 thus provides a set of K bits $B_0'$, $B_1'$, ... $B_{K-1}'$ synchronized with the M-K bits in the second set. Except where a replacement is performed, each bit in the synchronized set is the same as the like-numbered bit in the original set.

Figure 2:
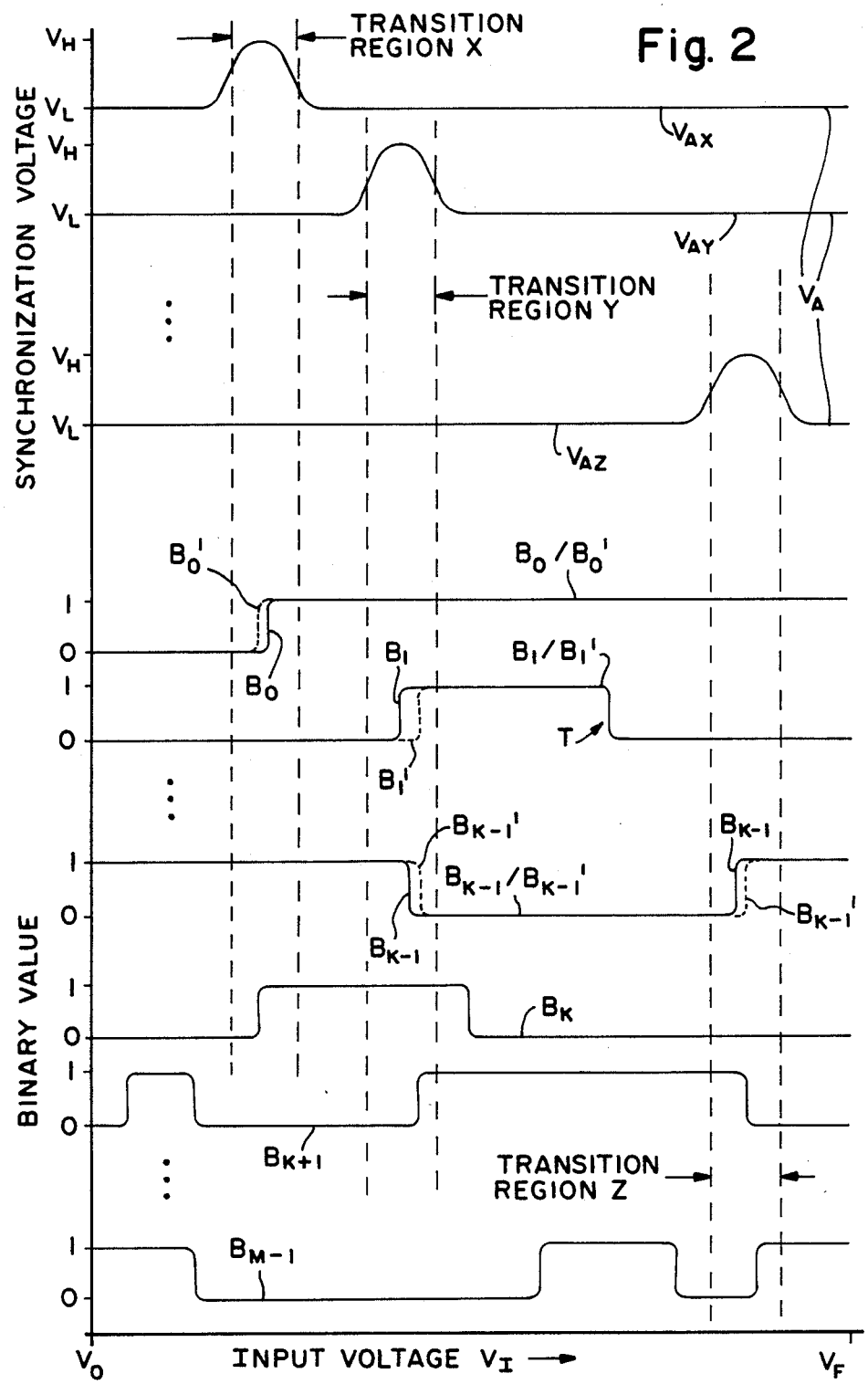
FIGS. 2 and 3 are graphs indicating how the synchronization signals and bits vary as a function of input voltage for the ADC of FIG. 1.

The specific operation of the synchronization stage is facilitated with the assistance of the graph shown in FIG. 2. Depending on the algorithm followed by the code, one of two situations exists for each value of input $V_I$ at which a bit in the first set makes a transition: (1) at least one bit in the second set ideally makes a simultaneous transition, or (2) no bit in the second set ideally makes a simultaneous transition. Starting with the last-mentioned situation, this case is represented by transition T of bit $B_1$ in FIG. 2. None of bits $B_K$–$B_{M-1}$ ideally make transitions simultaneous with transition T. Consequently, no bit synchronization problem exists here.

Turning to the first-mentioned situation, a voltage transition region is defined around each value of input $V_I$ at which a bit in the first set makes a transition ideally intended to be simultaneous with the transition of a corresponding bit in the second set. The transition regions are sufficiently narrow that each bit within a transition region makes only a single transition between "0" and "1". However, the regions are sufficiently wide that the likelihood of a transition occurring outside the intended region is usually very small.

FIG. 2 illustrates three transition regions X, Y, and Z generally centered around respective transitions in bits $B_0$, $B_1$, and $B_{K-1}$. Bit $B_{K-1}$ is also shown as making a transition within region Y. The transitions for the corresponding bits in the second set can be seen by inspection. Note that there are two possible corresponding bits in the second set for the $B_{K-1}$ transition in region Z.

Control circuit 14 supplies one $V_A$ synchronization signal for each transition region. Each synchronization signal is thereby associated with one or more particular bits in the first set. Each $V_A$ signal reaches a specified condition when input $V_I$ is in the transition region for the associated bit or bits in the first set.

FIG. 2 depicts three such synchronization signals $V_{AX}$, $V_{AY}$, and $V_{AZ}$ respectively associated with transition regions X, Y, and Z. Each of signals $V_{AX}$–$V_{AZ}$ is normally at a low voltage $V_L$ and goes to a high voltage $V_H$ when input $V_I$ enters the associated transition region. The boundaries of regions X-Z are set at points where the $V_A$ signals are approximately equal to $(V_L + V_H)/2$. That is, the specified $V_A$ condition mentioned in the previous paragraph occurs when each $V_A$ signal rises above a threshold voltage approximately equal to $(V_L + V_H)/2$.

When a $V_A$ signal is at the specified condition, substitution circuit 16 replaces the value of each associated bit in the first set either (a) with the value of the corresponding bit in the second set or (b) with the value of the binary complement of the corresponding bit in the second set in such a way as to meet the prescribed algorithm. For example, circuit 16 uses the true value of the corresponding bit in a second set when the transitions of the two bits are in the same direction. The reverse applies when the transitions are in opposite directions. The dotted lines in FIG. 2 indicate the replaced bit values. In this way, the invention synchronizes transitions in bits $B_0$–$B_{K-1}$ with transitions in bits $B_K$–$B_{M-1}$.

Synchronization errors of lesser significance may exist among transitions of bits in the second set. The effect of these errors can be minimized by utilizing a single bit in the second set for performing all the replacements within a transition region. That is, circuit 16 performs each replacement in the region using either the true or complementary value of this bit. Depending on the algorithm prescribed for bits $B_1$–$B_M$, one bit in the second set may be used in performing all the replacements in all the transition regions.

Figure 3:
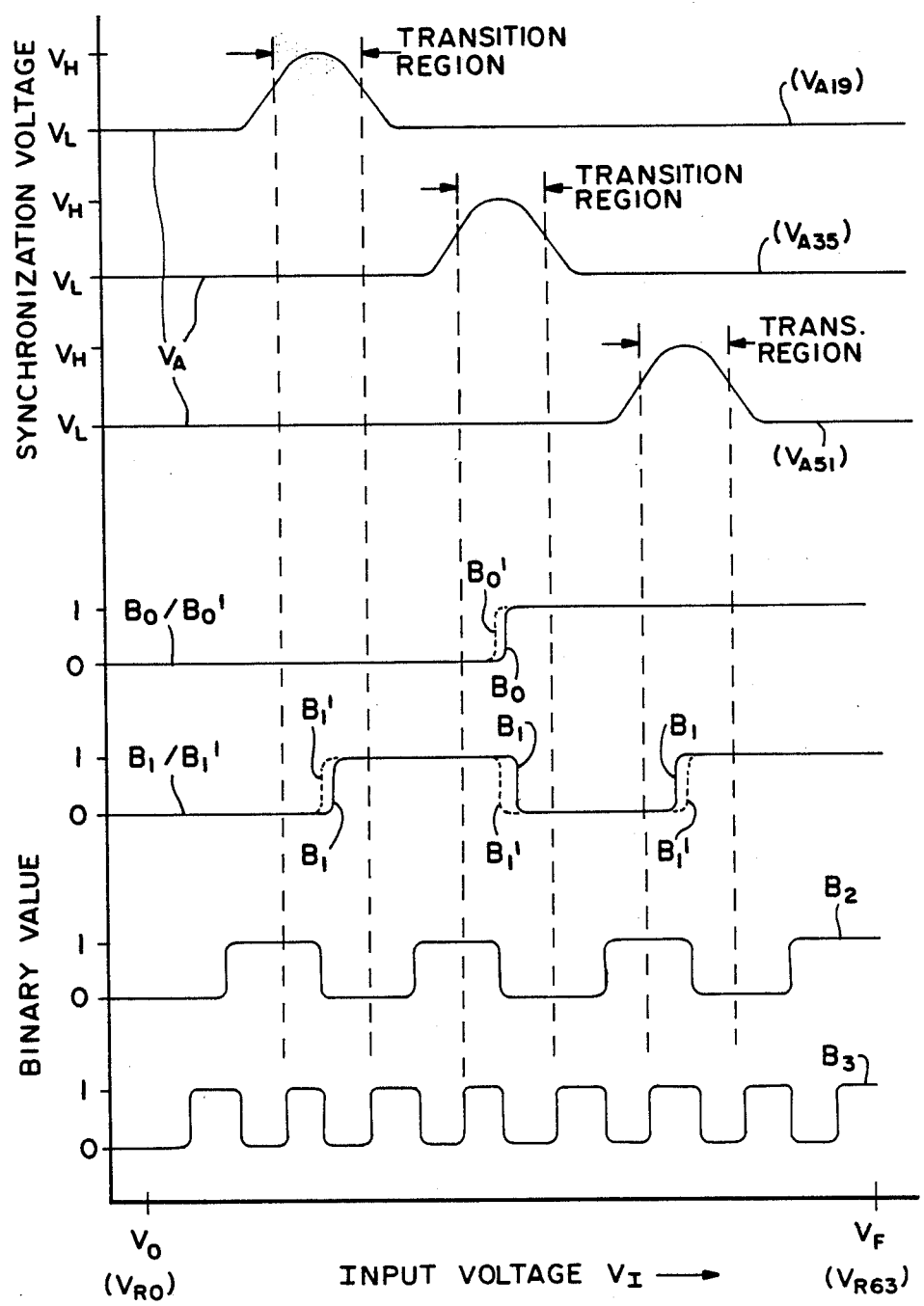

The prescribed algorithm is preferably a binary number code in which bits $B_0$–$B_{M-1}$ decrease progressively in significance as the bit number increases. Bits $B_0$–$B_{K-1}$ are thereby the coarse bits. Bits $B_K$–$B_{M-1}$ are the fine bits. FIG. 3 illustrates how a binary number code varies as a function of input $V_I$ for the case where both K and M-K are equal to 2.

To obtain the greatest synchronization accuracy in the binary number code situation, substitution circuit 16 only uses the most significant fine bit $B_K$ for replacement purposes. This is bit $B_2$ in FIG. 3. More specifically, circuit 16 employs the following replacement procedure in each transition region. The value of the complement of the most significant fine bit is substituted for the value of each coarse bit if it is the most significant bit making a transition within that region. The true value of the most significant fine bit is substituted for the value of each other coarse bit that makes a transition within that region. The replacement algorithm can be expressed as:

$$B_j = \begin{cases} B_j & j > p \\ B_{NK} & j = p \\ B_K & j < p \end{cases}$$

where the subscript j is an integer running from 0 to K-1, p is an integer equal in value to the subscript of the most significant coarse bit $B_p$ making a transition within the transition region, and $B_{NK}$ is the complement of $B_K$.

The transition regions have largely the same width. As indicated in FIG. 3, the width is preferably equal to one half of the average spacing between consecutive transitions of the least significant coarse bit $B_{K-1}$. In addition, the number of transition regions is equal to the number of transitions made by bit $B_{K-1}$.

Figure 4:
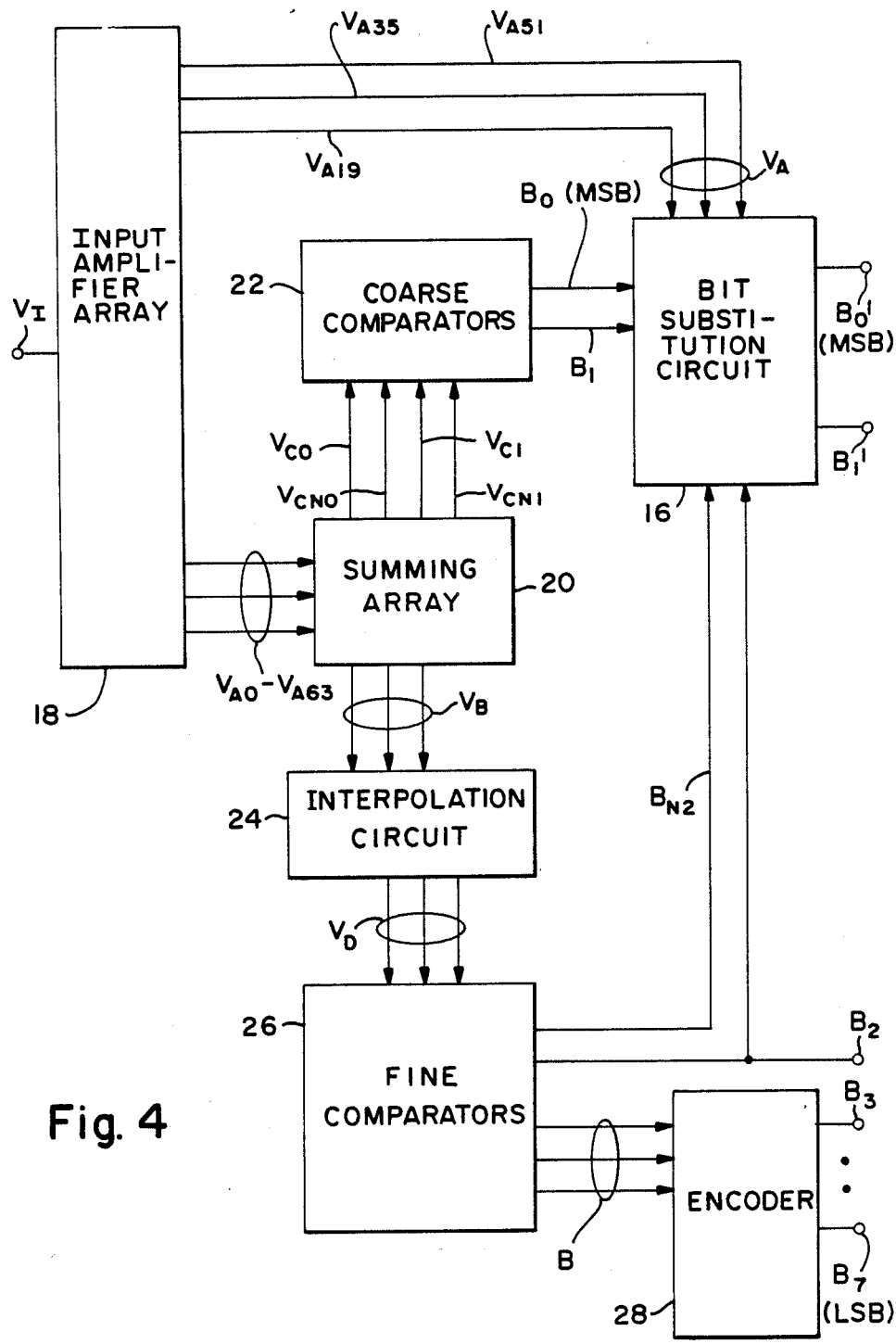
FIG. 4 is a block diagram of a folding-type embodiment of the ADC of FIG. 1.

The invention is particularly useful in ADCs of the folding type. Turning to FIG. 4, it depicts an application of the invention to a multiple-folding ADC that generates an 8-bit binary number code consisting of two coarse bits supplied along one analog path and six fine bits supplied along another analog path. Coarse conversion circuit 10 of FIG. 1 is implemented with an input amplifier array 18, a summing array 20, and a group of coarse comparators 22. Fine conversion circuit 12 of FIG. 1 is formed with arrays 18 and 20, an interpolation circuit 24, a group of fine comparators 26, and an encoder 28.

The $V_A$ synchronization signals consist of part of the amplifier signals normally supplied from amplifier array 18. No additional circuitry beyond that already present in array 18 is needed to implement control circuit 14 of FIG. 1. This provides a particularly efficient arrangement.

Figure 5:
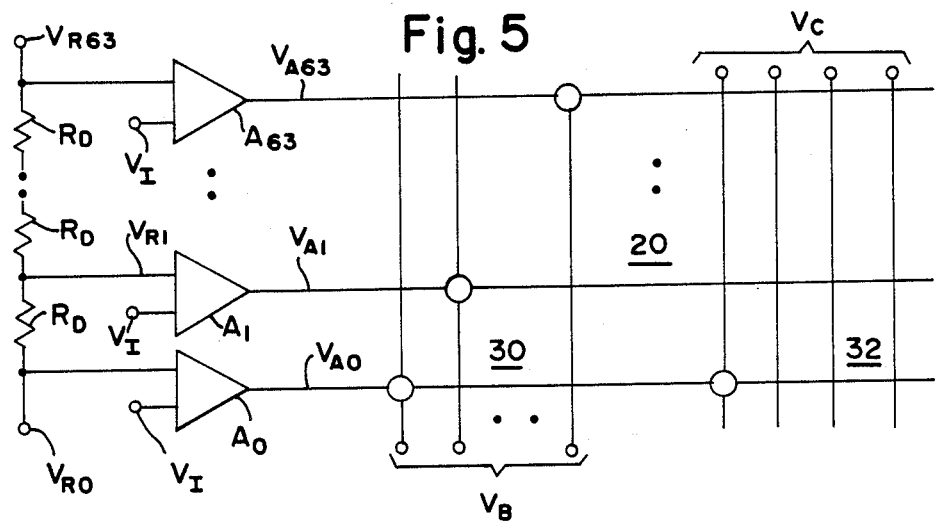
FIG. 5 is a circuit diagram of the input amplifier and summing arrays in the ADC of FIG. 4.

FIG. 5 shows details of arrays 18 and 20. Amplifier array 18 contains 64 input amplifiers $A_0$–$A_{63}$ arranged in 8 rows by 8 columns. Letting i be a running integer, each amplifier $A_i$ amplifies the difference between input voltage $V_I$ and a corresponding reference voltage $V_{Ri}$ to produce an intermediate voltage $V_{Ai}$. Reference voltages $V_{R0}$, $V_{R1}$ ... $V_{R63}$ are supplied from a resistive divider at equally spaced intervals across the input range from $V_{R0}$ to $V_{R63}$.

Figure 6:
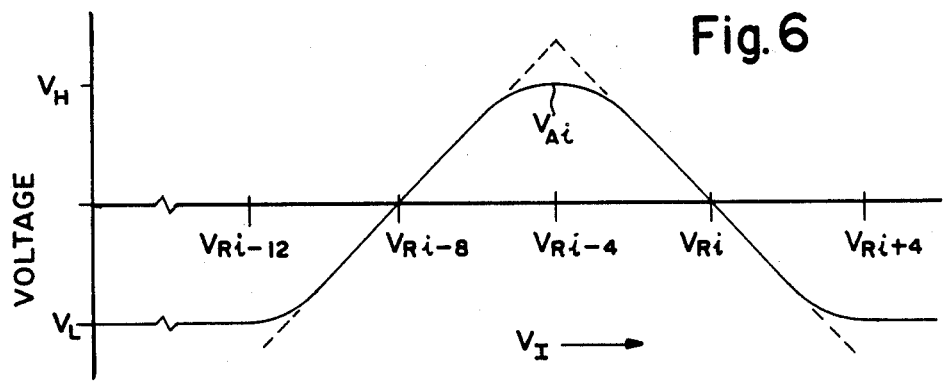
FIG. 6 is a graph showing how the output voltage from a typical input amplifier in the amplifier array of FIG. 5 varies with input voltage.

FIG. 6 illustrates the general shape for typical voltage $V_{Ai}$ as a function of $V_I$. $V_{Ai}$ would ideally have the triangular shape shown in dashed line. Due to practical amplifier characteristics, $V_{Ai}$ actually has the more rounded shape indicated in solid line. Each voltage $V_{Ai}$ exceeds threshold voltage $(V_L + V_H)/2$ when $V_I$ is between $V_{Ri-8}$ and $V_{Ri}$.

Figure 7:
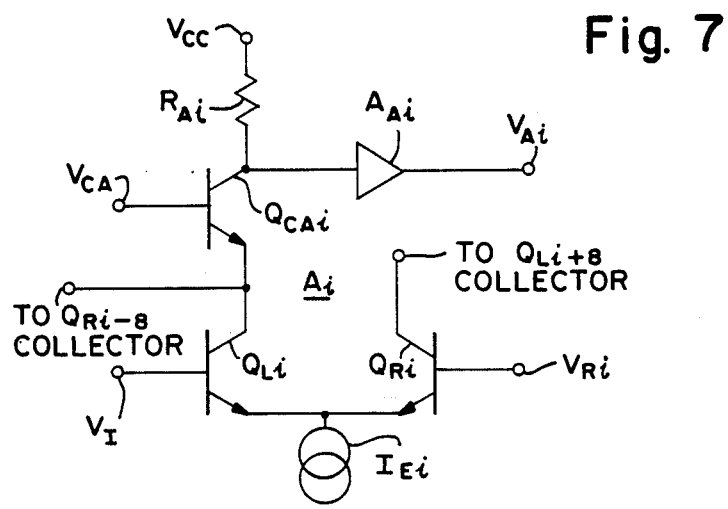
FIG. 7 is a circuit diagram of this amplifier.

The internal configuration for typical amplifier $A_i$ is depicted in FIG. 7. The collectors of emitter-coupled NPN transistors $Q_{Li}$ and $Q_{Ri}$ are respectively connected to the collectors of transistors $Q_{Ri-8}$ and $Q_{Li+8}$ in amplifiers $A_{i-8}$ and $A_{i+8}$. Amplifier $A_i$ operates in a differential manner in conjunction with amplifier $A_{i-8}$. When $V_I$ equals $V_{Ri}$, the differential pair $Q_{Li} Q_{Ri}$ is balanced so that $V_{Ai}$ has a zero crossing. The differential pair $Q_{Li-8}$ and $Q_{Ri-8}$ in amplifier $A_{i-8}$ is similarly balanced when $V_I$ equals $V_{Ri-8}$. Due to the collector cross coupling, $V_{Ai}$ has another zero crossing at that point. The result is that $V_{Ai}$ reaches $V_H$ when $V_I$ equals $V_{Ri-4}$ and is constant at $V_L$ when $V_I$ is less than $V_{Ri-12}$ or greater than $V_{Ri+4}$.

Summing array 20 is subdivided into a folding array 30 and a coarse summing section 32 as indicated back in FIG. 5. Folding array 30 electrically combines every sixteenth intermediate signal $V_{Ai}$ to produce eight pairs of complementary folded voltages $V_B$. Summing section 32 electrically combines certain of the $V_{Ai}$ signals to generate two pairs of complementary voltages $V_C$. The circles in FIG. 5 represent the particular couplings to the $A_i$ amplifiers.

Returning to FIG. 4, coarse comparator group 22 consists of two master-slave flip-flops that generate coarse bits $B_0$ and $B_1$ by comparing the two true $V_C$ voltages with their respective complements.

Figure 8:
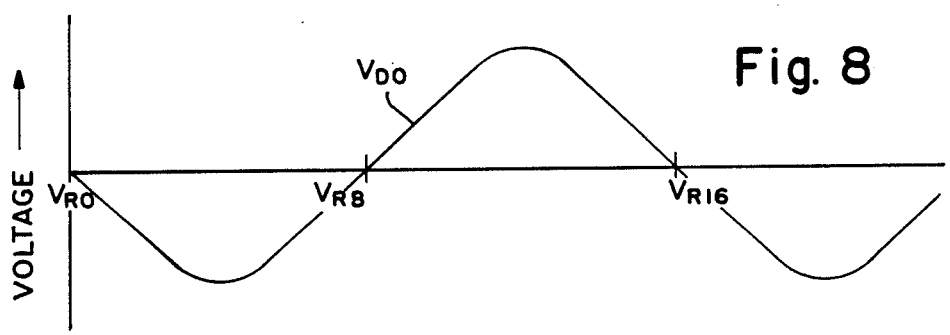
FIG. 8 is a graph showing how a typical folding voltage supplied from the interpolation circuit in the ADC of FIG. 4 varies with input voltage.

Interpolation circuit 24 interpolates by a factor of four between consecutive $V_B$ voltages to produce 32 pairs of complementary folded voltages $V_D$. Circuit 24 is preferably embodied in the manner disclosed in U.S. patent application Ser. No. 127,867, filed 2 Dec. 1987. FIG. 8 depicts a typical one of voltages $V_D$ as a function of $V_I$.

Fine comparator group 26 consists of a flip-flop ladder that compares the 32 true $V_D$ voltages with their respective complements to generate a string of 32 bits B in a circular code. The bit signals supplied from the ladder include the most significant fine bit $B_2$ and its complement $B_{N2}$ as indicated in FIG. 4. The ladder is preferably implemented in the manner described in co-filed U.S. Pat. No. 4,870,417.

Encoder 28 converts bit string B into fine bits $B_3$–$B_7$. Encoder 28 is formed with suitable input logic and an appropriately programmed read-only memory. The additional digital processing used to generate bits $B_3$–$B_7$ beyond that experienced by bit $B_2$ usually does not in itself introduce any significant synchronization problems among the fine bits.

Figure 9:
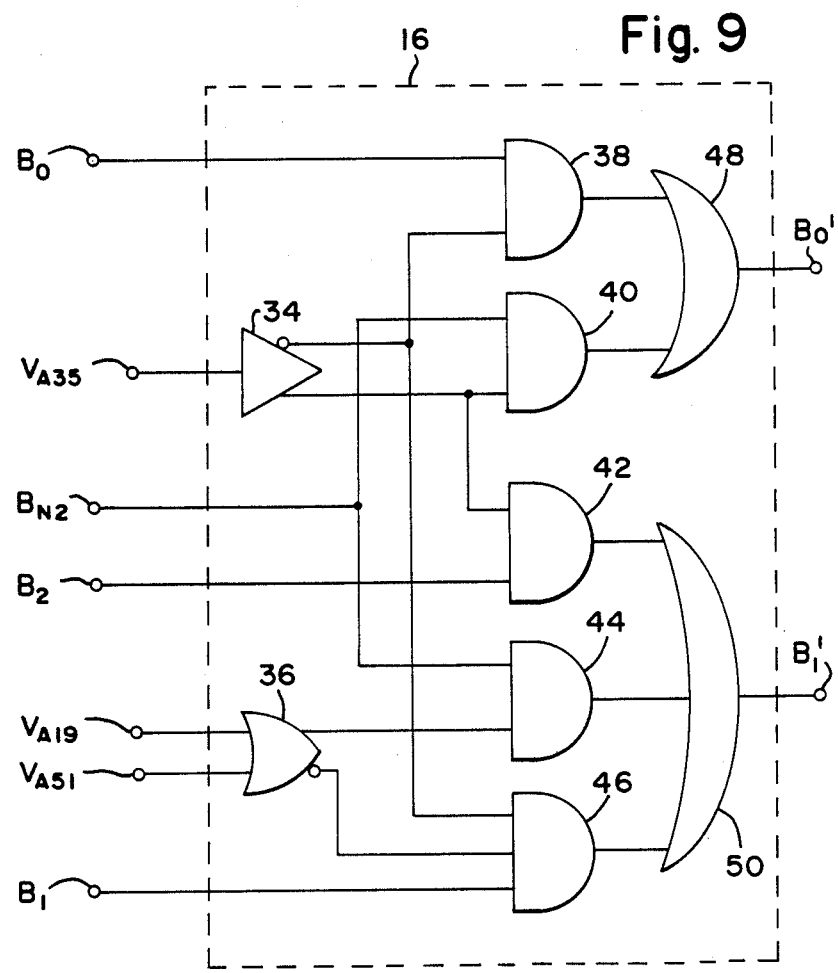
FIG. 9 is a logic diagram for the bit substitution circuit in the ADC of FIG. 4.

FIG. 9 shows a functional equivalent of a preferred embodiment for the internal circuitry of substitution circuit 16. This functional equivalent consists of a complementary-output buffer 34, an OR/NOR gate 36, AND gates 38, 40, 42, 44, and 46, and OR gates 48 and 50 interconnected in the indicated way. Gates 34–50 operate according to conventional combinatorial principles. Gates 38–50 are preferably implemented in current-mode logic (CML) using one CML gate for gates 38, 40, and 48 and another CML gate for gates 42–46 and 50.

Synchronization signals $V_A$ supplied to substitution circuit 16 in FIG. 9 consist of amplifier voltages $V_{A19}$, $V_{A35}$, and $V_{A51}$ provided from input amplifier array 18 in FIG. 4. Although the ADC in FIG. 4 generates an 8-bit binary number code, only coarse bits $B_0$ and $B_1$ and fine bit $B_2$ are specifically involved in the synchronization scheme. The same applies to the 4-bit binary number code represented in FIG. 3. Consequently, the three synchronization signals that respectively identify when input $V_I$ is in the low, middle, and high transition regions shown in FIG. 3 are roughly equivalent to signals $V_{A19}$, $V_{A35}$, and $V_{A51}$.

The specific operations performed by circuit 16 in FIG. 4 consist of (a) replacing the value of bits $B_0$ and $B_1$ respectively with the values of bits $B_{N2}$ and $B_2$ if $V_{A35}$ is greater than $(V_L+V_H)/2$ and (b) replacing the value of bit $B_1$ with the value of bit $B_{N2}$ if $V_{A19}$ or $_{A51}$ is greater than $(V_L+V_H)/2$. A noteworthy feature of this substitution is that the value of bit $B_1$ is replaced with the value of bit $B_{N2}$ when $V_I$ is in either the low or high transition region shown in FIG. 3. Consequently, a logical OR combinatorial operation can be performed on voltages $V_{A19}$ and $V_{A35}$ as indicated by OR/NOR gate 36 in FIG. 9. More generally, circuit 16 can use a gate that generates the logical OR of each group of synchronization signals for which the same replacements are performed.

While the invention has been described with reference to particular embodiments, this description is solely for the purpose of illustration and is not to be construed as limiting the scope of the invention claimed below. For example, the definitions of binary "0" and "1" are arbitrary and could be reversed from what is described above. Where the same replacements are made in a group of transition regions, a single synchronization signal could be initially defined instead of a group of synchronization signals combined by a logical OR operation.

The algorithm for the bits could consist of two or more sub-algorithms such as a binary number code for the bits in the first set and a Gray code for the bits in the second set. Multiple applications of the invention can be made if there are three or more generally different sets of bits. Various modifications and applications may thus be made by those skilled in the art without departing from the true scope and spirit of the invention as defined in the appended claims.

We claim:

1. An electronic circuit comprising a main stage for producing a digital code formed with a plurality of binary bits that make transitions between a pair of binary values as a function of an input parameter, the transitions ideally occurring in accordance with a prescribed algorithm as the input parameter traverses an input range, the bits divided into a first set of at least one bit and a second set of at least one bit, characterized by a synchronization stage comprising:
    control means responsive to the input parameter for generating at least one synchronization signal, each synchronization signal reaching a specified condition when the input parameter is in a transition region of the input range where a bit in the first set associated with that synchronization signal makes a single transition and where a corresponding bit in the second set makes a single transition; and
    substitution means responsive to each synchronization signal when it is at its specified condition for replacing the value of each associated bit in the first set either with the value of the corresponding bit in the second set or with the value of the binary complement of the corresponding bit in the second set in such a manner as to satisfy the prescribed algorithm.

2. A circuit as in claim 1 characterized in that the substitution means performs every replacement in a transition region using either the value of a single bit in the second set or the value of the binary complement of that bit.

3. A circuit as in claim 1 wherein there are first and second bit-generation paths through the main stage, each bit in the first set is generated along the first path, and each bit in the second set is generated along the second path, characterized in that the specified condition for each synchronization signal consists of it either being greater than a threshold voltage or being less than the threshold voltage.

4. A circuit as in claim 3 characterized in that there is only one transition region for each synchronization signal.

5. A circuit as in claim 3 wherein there are at least two bits in each set, characterized in that the substitution means performs every replacement in a transition region using either the value of a single one of the bits in the second set or the value of the binary complement of that bit.

6. A circuit as in claim 1 characterized in that:
    the main stage comprises (a) means responsive to the input parameter for producing a plurality of intermediate signals that vary between first and second levels as the input parameter traverses the input range, each intermediate signal being at the first level for most of the traverse of the input parameter across the input range and reaching the second level at a different value of the input parameter than each other intermediate signal, and (b) means responsive to the intermediate signals for generating each bit in the second set; and
    the synchronization stage comprises part of the main stage, each synchronization signal being one of the intermediate signals.

7. An electronic circuit comprising a main stage for producing a digital code formed with a plurality of binary bits that make transitions between a pair of binary values as a function of an input parameter, the transitions ideally occurring in accordance with a binary number code algorithm as the input parameter traverses an input range, the bits divided into a set of at least one coarse bit and a set of at least one fine bit, each coarse bit being more significant than each fine bit, characterized by a synchronization stage comprising:
    control means responsive to the input parameter for generating at least one synchronization signal, each synchronization signal reaching a specified condition when the input parameter is in a transition region of the input range where a coarse bit associated with that synchronization signal makes a single transition and where the most significant fine bit makes a single transition; and
    substitution means responsive to each synchronization signal when it is at its specified condition for replacing the value of each associated coarse bit either with (a) the value of the binary complement of the most significant fine bit if that coarse bit is the most significant coarse bit making a transition within each transition region for that signal or with (b) the value of the most significant fine bit if that coarse bit is not the most significant coarse bit making a transition within each transition region for that signal.

8. A circuit as in claim 7 characterized in that the specified condition for each synchronization signal consists of it either being greater than a threshold voltage or being less than the threshold voltage.

9. A circuit as in claim 8 wherein there are at least two coarse bits, characterized in that there are at least three transition regions.

10. A circuit as in claim 9 characterized in that the transition regions have largely the same width.

11. A circuit as in claim 10 characterized in that the width of the transition regions is largely equal to one half of the average spacing between consecutive transitions of the least significant coarse bit.

12. A circuit as in claim 5 wherein there are at least two coarse bits, characterized in that the control means generates at least three synchronization signals, one for each transition of the least significant coarse bit.

13. A circuit as in claim 12 characterized in that the substitution means comprises gating means for generating the logical OR of each group of particular synchronization signals for which the substitution means performs the same replacements.

14. A circuit as in claim 7 characterized in that the stages comprise:
   means for providing a plurality of reference voltages spaced across an input voltage range;
   means responsive to an input voltage that varies across the input voltage range for generating a plurality of intermediate voltages respectively corresponding to the reference voltages, each intermediate voltage being on a specified side of a threshold voltage when the input voltage bears a specified relationship to the corresponding reference voltage, the specified relationships being largely the same for all the intermediate voltages, the input voltage being the input parameter, and each synchronization signal being one of the intermediate voltages; and
   means responsive to the intermediate signals for generating each fine bit.

* * * * *